US012787697B2

(12) United States Patent
Agarwal et al.

(10) Patent No.: US 12,787,697 B2
(45) Date of Patent: Nov. 3, 2026

(54) METHOD FOR FABRICATING SILICON CHIP CARRIERS USING WET BULK MICROMACHINING FOR IR DETECTOR APPLICATIONS

(71) Applicant: COUNCIL OF SCIENTIFIC AND INDUSTRIAL RESEARCH, New Delhi (IN)

(72) Inventors: Pankaj Bhooshan Agarwal, Pilani (IN); S. Santosh Kumar, Pilani (IN); Sanjeev Kumar, Pilani (IN)

(73) Assignee: COUNCIL OF SCIENTIFIC & INDUSTRIAL RESEARCH, New Delhi (IN)

( * ) Notice: Subject to any disclaimer, the term of this patent is extended or adjusted under 35 U.S.C. 154(b) by 198 days.

(21) Appl. No.: 18/852,878

(22) PCT Filed: Mar. 30, 2023

(86) PCT No.: PCT/IN2023/050310
§ 371 (c)(1),
(2) Date: Sep. 30, 2024

(87) PCT Pub. No.: WO2023/187834
PCT Pub. Date: Oct. 5, 2023

(65) Prior Publication Data

US 2025/0210388 A1 Jun. 26, 2025

(30) Foreign Application Priority Data

Mar. 30, 2022 (IN) ............................. 202211019406

(51) Int. Cl.
*H10P 72/10* (2026.01)

(52) U.S. Cl.
CPC .................................. *H10P 72/165* (2026.01)

(58) Field of Classification Search
None
See application file for complete search history.

(56) References Cited

U.S. PATENT DOCUMENTS 6,040,618 A 3/2000 Akram
6,366,468 B1 * 4/2002 Pan ...................... B41J 2/14024 257/E29.022
6,393,685 B1 * 5/2002 Collins .................. B81C 3/008 216/36

FOREIGN PATENT DOCUMENTS

CN 103213935 A 7/2013
DE 102015208701 A1 11/2016

OTHER PUBLICATIONS

International Search Report mailed Jun. 30, 2023, in reference to co-pending Indian Application No. PCT/IN20213/050310 filed Mar. 30, 2023.

(Continued)

*Primary Examiner* — Roberts P Culbert
(74) *Attorney, Agent, or Firm* — DINSMORE & SHOHL LLP

(57) ABSTRACT

The invented method is to realize a silicon chip carrier using wet bulk micromachining of silicon. In the silicon chip carrier, three (or more) supports are realized solely based on the wet etching of the silicon. The fabricated supports are triangular in shape and provide a minimum contact area between the sensing element and carrier. The invention provides a simple, cost-effective fabrication technology, which uses anisotropic wet etchant for silicon bulk-micromachining. A fabricated silicon wafer can be diced as per the requirement of single/multiple channel IR detectors. These chip carriers will cut down the IR detector cost with attractive lower thermal conductance in the field of gas sensors, spectrometry, thermal imaging, and fire detection.

3 Claims, 8 Drawing Sheets

(56) References Cited

OTHER PUBLICATIONS

Written Opinion mailed Jun. 30, 2023, in reference to co-pending Indian Application No. PCT/IN20213/050310 filed Mar. 30, 2023.

* cited by examiner

METHOD FOR FABRICATING SILICON CHIP CARRIERS USING WET BULK MICROMACHINING FOR IR DETECTOR APPLICATIONS

CROSS REFERENCES TO RELATED APPLICATIONS

This application is a national-stage application under 35 U.S.C. § 371 of International Application No. PCT/IN2023/050310, filed Mar. 30, 2023, which International Application claims benefit of priority to Indian Patent Application number 202211019406, filed Mar. 30, 2022.

TECHNICAL FIELD OF INVENTION

The present invention relates to a method of fabricating silicon chip carriers with triangular-shaped supports for miniaturized single and multi-channel pyroelectric infrared (IR) detectors using only wet bulk micromachining, which is cost-effective and provides low thermal conductance. Moreover, a top part of a developed silicon chip carrier can easily accommodate optical filters corresponding to a desired IR-based gas detection. This silicon chip carrier can also be stacked on another chip carrier having a compensating element. This arrangement forms a compact assembly by reducing detector package size and allows the realization of a single/multi-channel detector in a smaller area. Pyroelectric IR detectors have many applications in the field of spectrometry, thermal imaging, flame detection, and gas sensing for industrial safety requirements. The IR-based gas detectors are also useful in medical sensor applications for the analysis of volatile organic compounds. The cost-effective fabrication of silicon chip carriers is helpful to reduce the overall cost of the fabricated IR detectors.

BACKGROUND OF INVENTION AND RELATED PRIOR ART

Continuous shrinking in sizes of sensors needs miniaturization of their individual components and also their improved integration in smaller package sizes without compromising their performance. In the case of pyroelectric IR detectors, a chip carrier is an essential component, which is used as a support for the sensing element. In this direction, silicon-based chip carriers with minimal supports isolate the detector element and have been proven as a novel option due to low heat dissipation, higher integration ability, and optimized field of view (FOV).

Prior art searches related to the invention in literature and patent databases provided the following references.

Reference may be made to a paper by Gunther and Ebermann (Compact pyroelectric detectors based on a micro-machined chip carrier, Proceedings of IRS$^2$ 2017, 804-808, 2017) and reference may also be made to German patent application DE102015208701A1 titled “Device for the simultaneous determination of several different substances and/or substance concentrations”, where a chip carrier with one or more supports for the pyroelectric detector element is realized by multistage etching using a combination of dry and wet etching/micromachining on a front and a back side of a silicon wafer. Metallization is carried out on both sides of the wafer to obtain an electrical connection between the top and bottom faces. The wafer is diced into individual chips and these individual chips are used to realize single/multi-channel detectors. However, the conventional configuration has a limitation, in that, it requires a dry etching process for the fabrication of silicon chip carrier components. This results in an increased cost for IR detectors. In addition, the wafer is sequentially subjected to two processes i.e. wet and dry etching using two different setups, thereby increasing the lead time. The supports in the chip carrier are shaped in the form of square/rectangle or circular segments, which increases the contact area between the carrier and the pyroelectric element.

Considering the above prior art, there is a scope to develop an economical and expeditious method of fabricating the silicon chip carriers with minimal contact area between the carrier and detector element.

OBJECTS OF THE INVENTION

The main object of the present invention is to provide a method for fabricating silicon chip carriers using solely wet bulk micromachining which obviates the drawbacks of the hitherto known prior art as detailed above. In the present invention, the fabrication method uses only a cost-effective anisotropic wet etchant for silicon bulk micromachining simultaneously from both sides of a silicon wafer to realize the chip carriers with triangular-shaped supports, which will minimize the contact area between carrier and detector element to enhance the performance of the device.

Another object of the present invention is to reduce the contact area between silicon chip carrier supports and a pyroelectric element using triangular-shaped supports.

Yet another object of the present invention is to provide good step coverage during metallization (on both sides of the wafer) to make an electrical connection between the top (side A) and bottom (side B) faces of the silicon wafer.

BRIEF DESCRIPTION OF DRAWINGS

The present invention is illustrated in FIG. 1 to 8 of the drawings accompanying this specification. In the drawings, reference numbers/letters indicate corresponding parts in the various figures.

DETAILED DESCRIPTION

Figure 1:
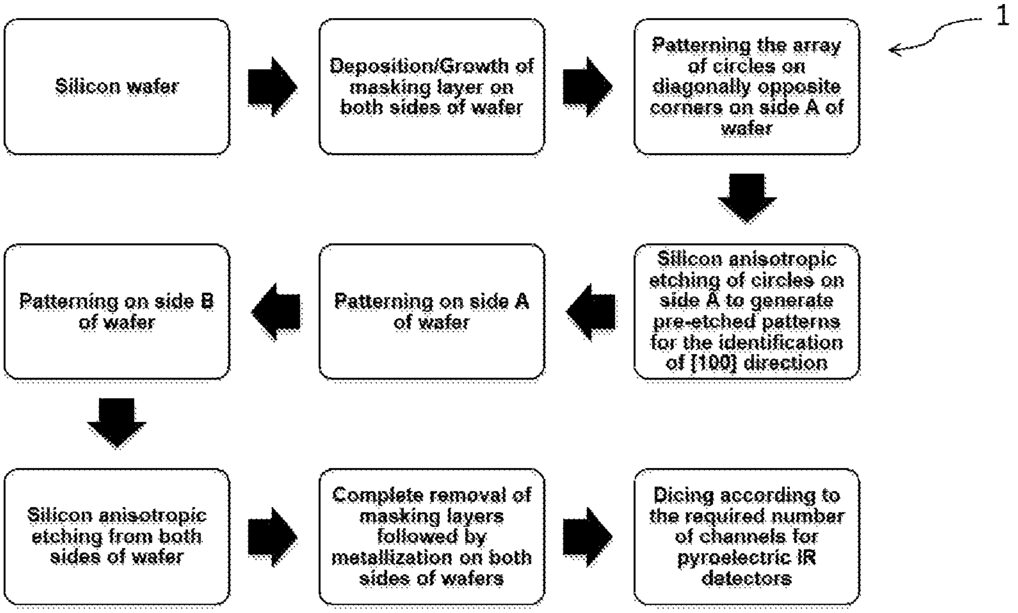
FIG. 1 represents a flow chart for a fabrication method of a silicon chip carrier.
Figure 2:
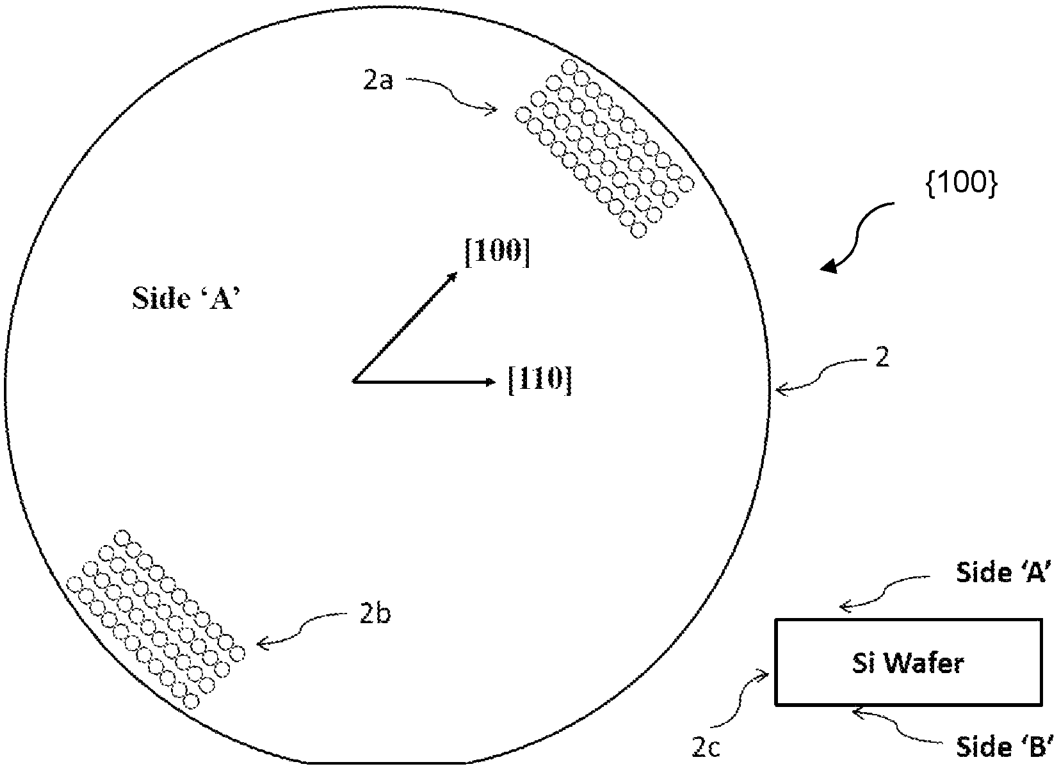
FIG. 2 represents circular patterns placed diagonally at 45° (w.r.t. direction [110]) at opposite ends of a silicon wafer side ‘A’ (shown in a cross-section of a silicon wafer).
Figure 5:
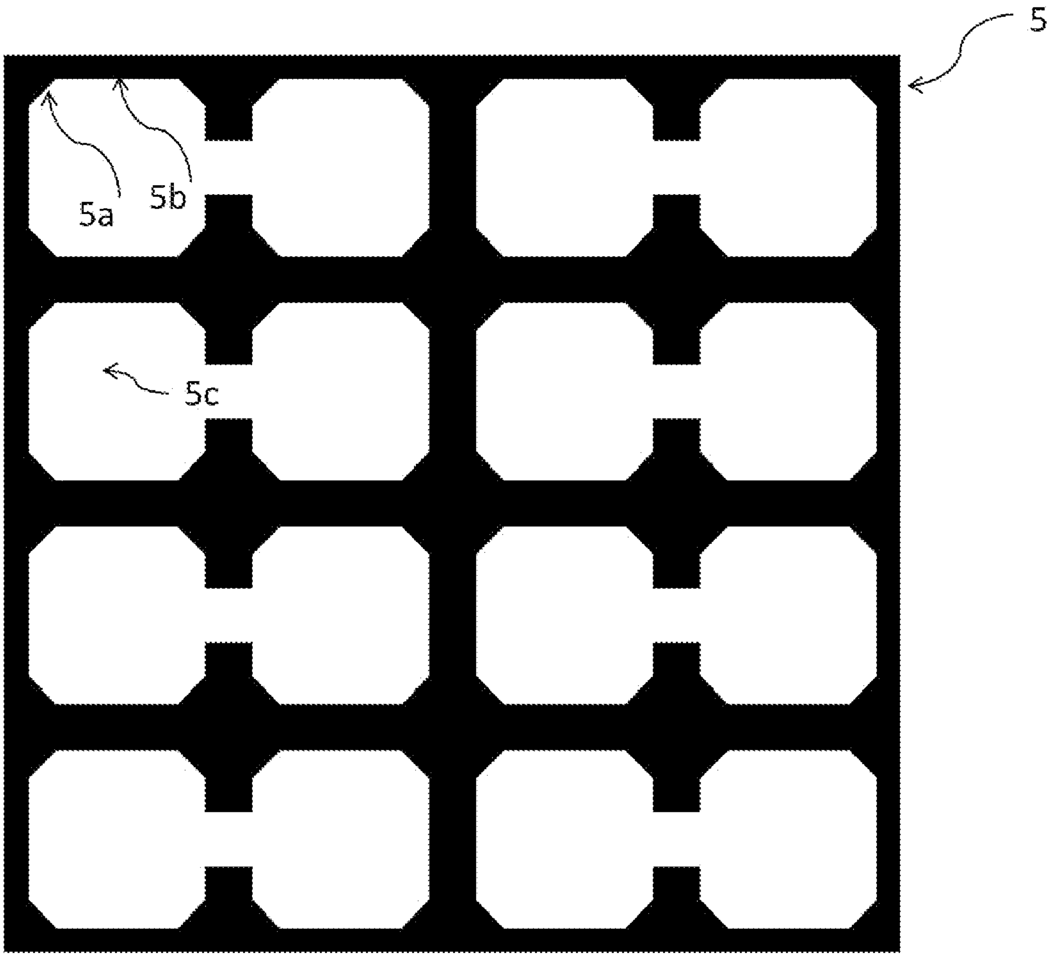
FIG. 5 and FIG. 6 represent an image of mask layouts, designed to perform wet bulk micromachining from sides A and B of the silicon wafer respectively.
Figure 6:
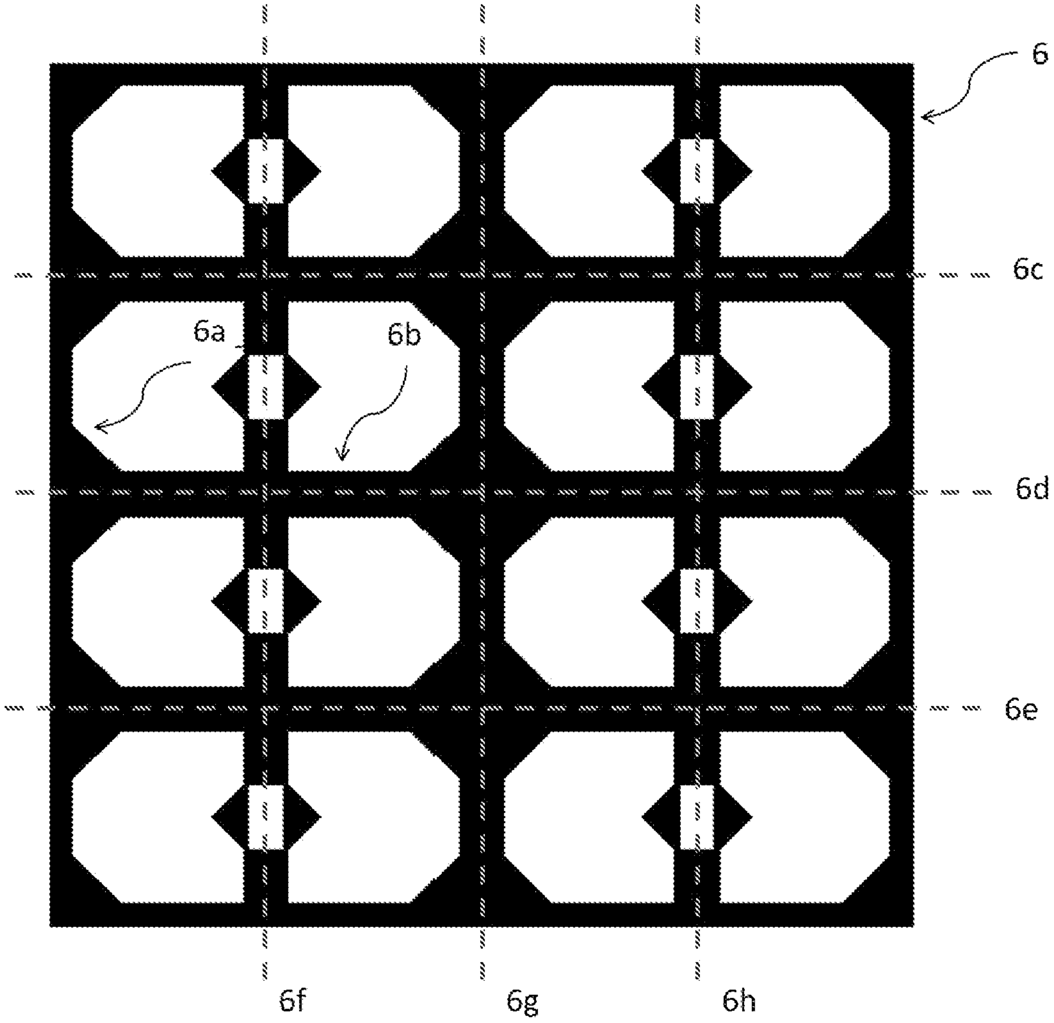

FIG. 1 represents a flow chart 1 in which a process begins with a double side polished silicon wafer 2 (as shown in FIG. 2), which is of orientation {100}. The thickness of the silicon wafer 2 is chosen according to a thickness of a pyroelectric element, which is to be accommodated on a chip carrier for IR detector fabrication. A layer of silicon dioxide ($SiO_2$) or any other suitable masking material for wet bulk micromachining is grown/deposited on both sides of the silicon wafer 2. Photolithography is carried out to pattern a series of circles 2*a* and 2*b* diagonally over the silicon wafer 2 on side A. Anisotropic etching is performed using wet etchant (tetramethylammonium hydroxide: TMAH/potassium hydroxide: KOH/ethylene diamine pyco-catechol: EDP) to generate pre-etched pattern 2*a*' using which direction [100] is precisely identified as reported by Singh and Pal (Precise identification of the direction [100] on the silicon wafer 2 using a novel self-aligning pre-etched technique, J. Micromech. Microeng. 26 025012 (5 pp.) 2016). A suitable surfactant (like Triton-100/isopropanol: IPA) can be used to minimize the undercutting. With the help of selected pre-etched patterns (alignment marks), the patterning in a masking layer is carried out on the side A of the silicon wafer 2 using a mask layout 5 (as shown in FIG. 5) followed by patterning on side B of the silicon wafer 2 using a mask layout 6 (as shown in FIG. 6). Subsequently, silicon bulk micromachining is performed simultaneously (on both sides of the silicon wafer 2), till the time the silicon from both sides is completely etched in a center 5*c* of a carrier. Finally, the masking layer is etched/removed to achieve a silicon chip carrier 7. This silicon wafer 2 can be diced into single and multiple channels as per the requirement of the intended application.

Referring now to FIG. 2, for the identification of direction [100] and direction [110], the pre-etched technique proposed by Singh et al. 2016 is used. Usually, the primary cut along the direction [110] in the silicon wafer 2 is not accurate and typically has a 1-5° error. Therefore, for precise etching, it is necessary to identify the direction [100] and direction [110]. A set of four circles of 100 μm diameter are designed at 45° in the mask. Their centers are in a straight line, passing through the center of the silicon wafer 2 on the side A. These circles are separated at a distance of 45.5 μm, 44.5 μm, and 43.5 μm from each other in the radial direction. Furthermore, these circle patterns are repeated 24 times around the periphery on each side of the reference line at an angular interval of 0.16°. A similar set of circles are also patterned on the diagonally opposite side of the silicon wafer 2. The required number of circles, their diameters, and their distances can vary depending on the accuracy of wafer flats in the silicon wafer 2.

Figure 3:
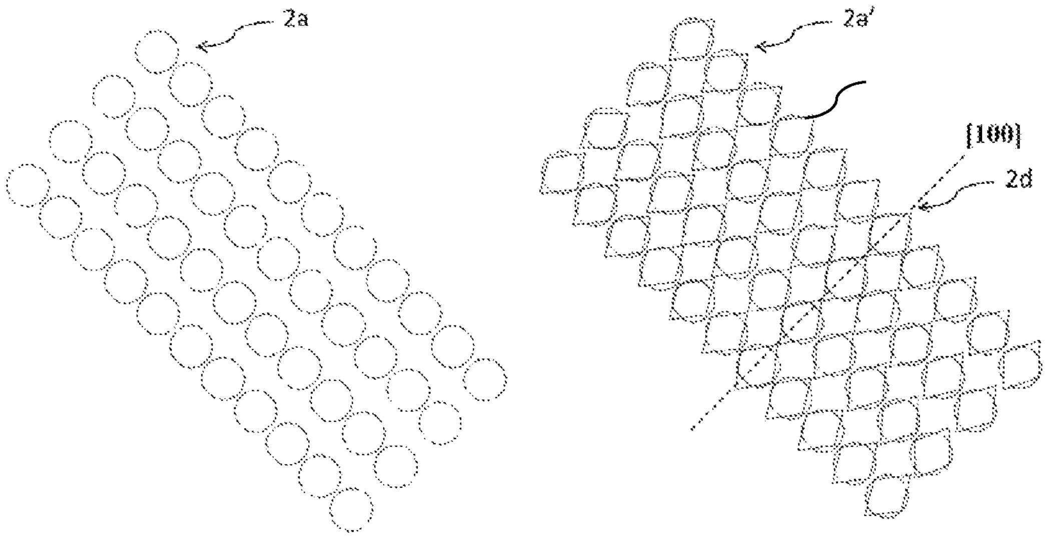
FIG. 3 shows pre-etched patterns generated from an array of circles after anisotropic etching.

Referring now to FIG. 3, after the anisotropic etching for a sufficient time, the circles 2*a* assume the shape of inverted pyramids 2*a*' (or square V-Grooves), i.e, the pre-etched pattern. The direction [100] is identified by a set of V-grooves (in a particular angular direction) with their notches aligned in one straight line 2*d*. Whereas, in all other V-grooves at other angular directions, the notches are mis-aligned.

Figure 4:
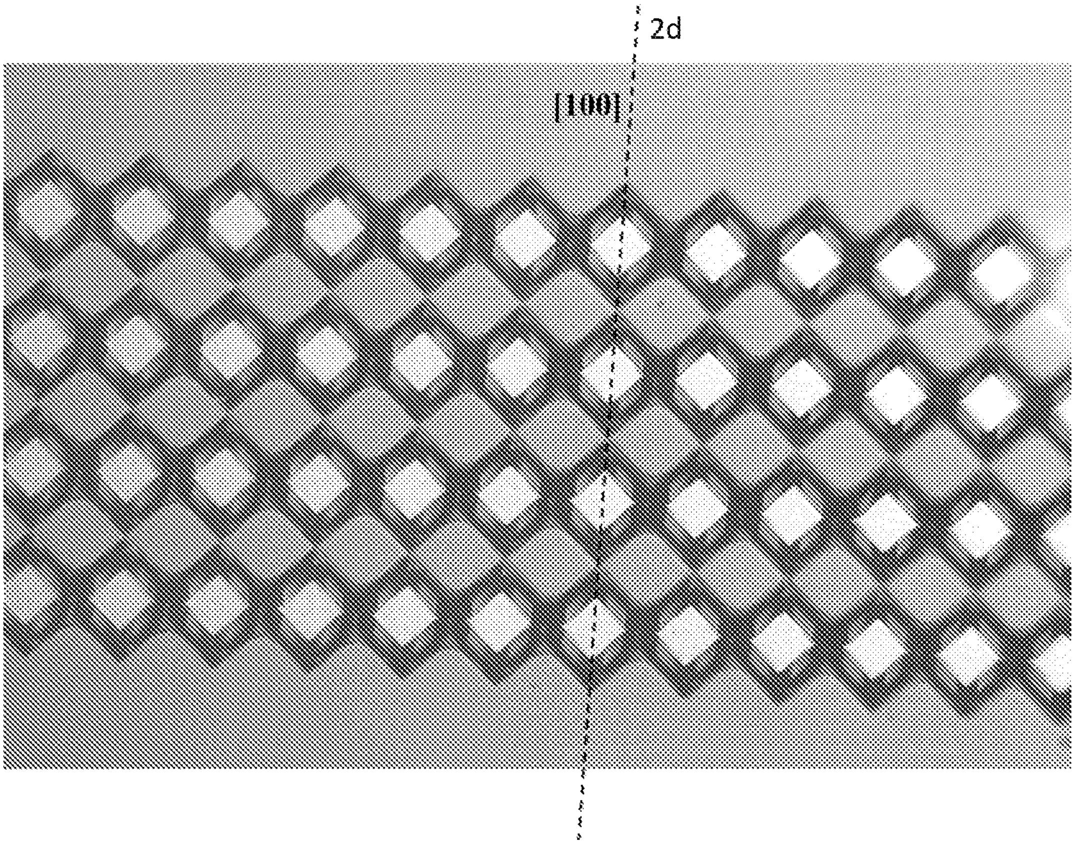
FIG. 4 depicts a direction [100] in the fabricated pre-etched pattern.

Referring now to FIG. 4, an optical snapshot of the generated pre-etched pattern shows the alignment of all notches generated from a particular set of four circles in a straight line 2*d*, which is the direction [100].

Referring now to FIG. 5, an edge 5*a* of the mask layout 5 is precisely aligned with pre-patterned alignment marks the straight line 2*d*, which is in the direction [100] and an edge 5*b* is automatically aligned in the direction [110]. Simultaneously, with the help of this alignment, the alignment marks on the side A are generated, which is to be used for patterning on a side B using a mask layout 6. The anisotropic etching using this mask layout 5 is performed to etch half the thickness of the silicon wafer 2 from the side A.

Similarly referring to FIG. 6, using the earlier generated alignment marks on side A, edges 6*a* and 6*b* are aligned with the direction [100] and the direction [110] respectively using the backside alignment (BSA) technique. The anisotropic etching using the mask layout 6 is performed to etch half the thickness of the silicon wafer 2 from the side B. After equal etching from both sides of the silicon wafer 2, the silicon is completely etched in center 5*c*. The silicon wafer 2 is diced (across dotted lines) as per the required number of channels. To realize a four-channel carrier, lines 6*c*, 6*e*, 6*f*, and 6*h* are used for dicing. Similarly, a two-channel carrier can be realized, either using a set of 6*c*, 6*d*, 6*e*, 6*f*, and 6*h* or a set of 6*d*, 6*f*, 6*g*, and 6*h* dicing lines. In the case of a single channel, dicing is carried out across all dicing lines namely 6*c*, 6*d*, 6*e*, 6*f*, 6*g*, and 6*h*.

Figure 7:
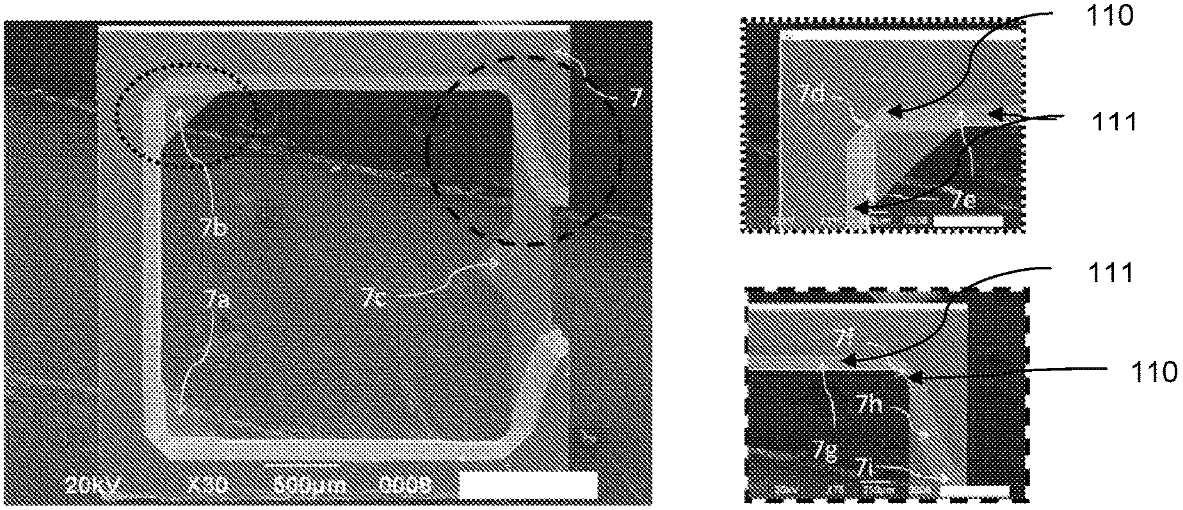
FIG. 7 and FIG. 8 shows scanning electron microscopy (SEM) images of the fabricated silicon chip carrier from side A and side B.

After performing etching from both sides of the silicon wafer 2 using the mask layouts 5 and 6, FIG. 7 represents an SEM image of single-channel silicon chip carrier 7 with three triangular supports 7*a*, 7*b*, and 7*c*, fabricated using wet bulk micromachining. The corner near 7*b* indicates a {110} plane 7*d* at 45° and {111} plane 7*e* at 54.7°. Similarly, at another corner, the {111} plane 7*g* is at 54.7° and {110} plane 7*f* is at 45°. The planes 7*h* and 7*i* are fast etching planes generated due to undercutting at a convex corner, while etching.

Figure 8:
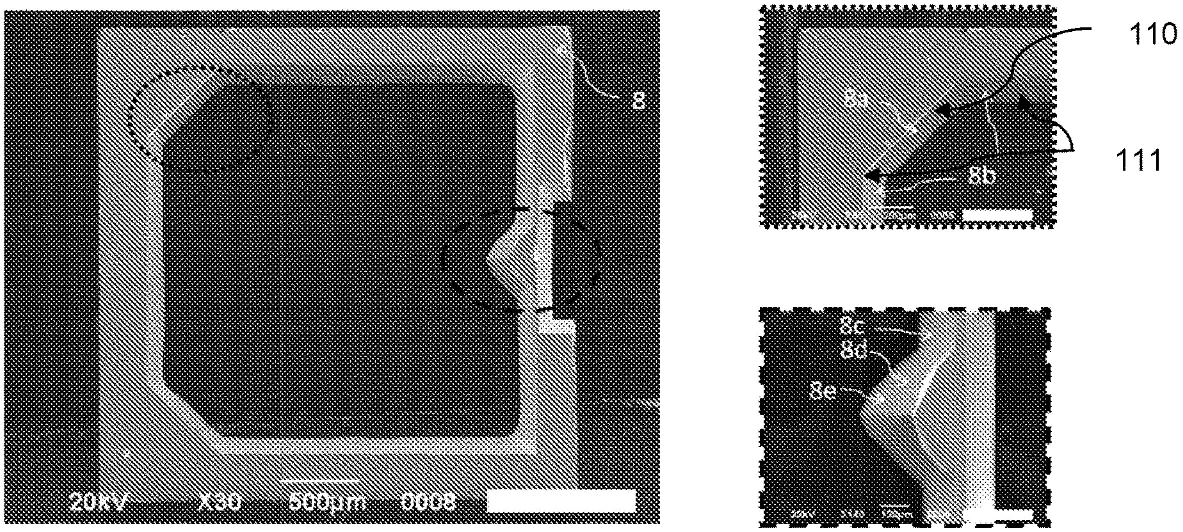

FIG. 8 shows an SEM image of the side B of the fabricated silicon chip carrier. The {110} plane 8*a* is at 45° and {111} planes 8*b* and 8*c* are at 54.7°. The planes 8*d* and 8*e* are fast etching planes generated after anisotropic etching from side B.

SUMMARY

The invention relates to the manufacturing of the silicon chip carrier 7 using micromechanical means, which is used as a support for pyroelectric elements in IR detector technology. Usually, these chip carriers are fabricated in the silicon wafer 2 through wet anisotropic etching using TMAH/KOH/EDP from one side and deep reactive ion etching (DRIE) from the other side of the silicon wafer to realize three or more supports for holding the pyroelectric detector element. The objective of this invention is to provide a simple, fast, cost-effective fabrication technology, which is solely based on wet etchants for silicon bulk-micromachining to realize the silicon chip carrier 7. The basic process of the carrier fabrication is to remove silicon from both sides of the silicon wafer 2 with controlled anisotropic etching to realize the three support points in silicon. These triangular-shaped support 7*a*, 7*b*, and 7*c* with minimum contact area (with pyroelectric sensing elements) are made through precise identification of direction [100] (at 45° angle w.r.t. direction [110]) in silicon wafer 2. The triangular-shaped supports 7*a*, 7*b*, and 7*c* minimize the contact area between the silicon chip carrier 7 and detector elements to reduce thermal conductance. Usually, the primary/secondary flats of supplied silicon wafers have an inaccuracy of 1-5° and therefore cannot be relied upon for precise identification of the direction [100]. Therefore, pre-etched patterns are created in the silicon wafer 2. After pre-etching, amongst the generated patterns a set self-aligns across direction [100] while other sets are misaligned. The plane shown in the 7*d*, 7*f*, and 8*a* is oriented at an angle of 45° to the wafer surface and appears along the direction [100]. The generated pre-etched patterns are used as alignment marks and help to perform etching at the plane at 45°, which leads to the fabrication of triangular-shaped supports with tapered walls for a mounting pyroelectric chip. These tapered walls at 45° and 54.7° on a top and bottom sides in the silicon chip carrier 7 help in perfect step coverage during metal deposition using sputtering, e-beam evaporation, and thermal evaporation to form an electrical connection between the metallic layers deposited on the top and the bottom sides of the silicon chip carrier 7. The identified [100] directed pre-etched patterns are used for photolithography on both sides of the silicon wafer 2 followed by wet silicon bulk micromachining to realize the silicon chip carriers 7. The silicon wafer 2 can be diced as per the requirement to obtain single/multiple channel IR detectors. These chip carriers help in cutting down the cost of the miniaturized single/multi-channel pyroelectric IR detectors and offer attractive lower thermal conductance.

Thus, summarizing the present invention, the present invention provides a method for the fabrication of the silicon chip carrier 7. The method comprises generating the pre-etched pattern 2*a*' to precisely identify the direction [100] and the direction [110] to fabricate three triangular supports 7*a*, 7*b*, and 7*c*, or more supports. Further, aligning precisely with the pre-etched pattern 2*a*', and with the mask layouts 5 and 6 on sides A and B of a silicon wafer 2, silicon wet bulk micromachining is carried out from the side A and side B of the silicon wafer 2 to realize the silicon chip carrier 7.

Further, some examples have been provided below to provide more clarification on the present invention:

Example 1

A method for silicon chip carrier 7 based solely on silicon wet bulk micromachining has been developed for IR detector applications. Silicon wafer-3 of 3-inch diameter, 340 μm thickness, 1-20 ohm-cm resistivity and orientation {100}±0.50 has been used for the process. After generating the pre-etched pattern on side A of the silicon wafer 2, out of the 49 sets of V-grooves, the notches of the pattern at the 28$^{th}$ position (clockwise from primary flat) are found aligned in the 2d i.e. direction [100]. The patterning using mask layouts 5 and 6 was carried out on side A and side B respectively for realizing the 2.95 mm×2.95 mm single chip carriers to accommodate the 2 mm×2 mm pyroelectric detector element. Silicon etching in TMAH (25% wt) along with surfactant Triton X-100 (0.1%) is carried out at 90° for 285 minutes simultaneously from both sides of the wafer. The SEM image of fabricated silicon chip carrier 7 has been captured from side A and side B.

Example 2

A method for fabricating silicon chip carrier 7 based solely on silicon wet bulk micromachining has been developed for IR detector applications. Another silicon wafer-5 of 3-inch diameter, 337 μm thickness, 1-20 ohm-cm resistivity and orientation {100}±0.50 has been used for the process. In generated pre-etched pattern on side A, the notches of the pattern at the 21$^{st}$ position (clockwise from primary flat) out of the 49 sets of V-grooves are in a straight line 2*d* in direction [100]. After patterning using layouts 5 and 6 on side A and side B respectively, silicon etching in TMAH (25% wt) along with surfactant Triton X-100 (0.1%) is carried out at 90° for 283 minutes on both sides of wafer to fabricate the 2.95 mm×2.95 mm single chip carriers to hold 2 mm×2 mm pyroelectric detector element. The SEM image of fabricated silicon chip carrier 7 confirms that the silicon chip carrier is of the same dimensions as obtained in Example 1.

The invention claimed is:

1. A method for fabricating a silicon chip carrier, the method comprising:

- generating a pre-etched pattern to precisely identify a first direction and a second direction to fabricate three or more triangular-shaped supports, wherein:
  - the first direction is identified by a set of V-grooves in a particular angular direction;
  - notches of the set of V-grooves are aligned in one straight line; and
  - notches of all other V-grooves at angular directions other than the particular angular direction are misaligned;
- aligning precisely, with the pre-etched pattern and with a first desired mask layout on a first side of a silicon wafer and a second desired mask layout on an opposite side of the silicon wafer; and
- etching silicon from the first side and the second side of the silicon wafer by a wet bulk micromachining until silicon is completely etched in a center of the silicon wafer to realize the silicon chip carrier.

2. The method according to claim 1, wherein the three or more triangular-shaped supports minimize a contact area between the silicon chip carrier and detector elements to reduce a thermal conductance.

3. The method according to claim 1, wherein the three or more triangular-shaped supports are fabricated with tapered walls, the tapered walls at 54.7° and 45° on a top side of the silicon chip carrier and a bottom side of the silicon chip carrier and being configured for perfect step coverage during metal deposition by sputtering, e-beam evaporation, or thermal evaporation to form an electrical connection between metallic layers deposited on the top and the bottom sides of the chip carrier.

* * * * *